(12) United States Patent
Stehle et al.

(10) Patent No.: US 10,494,253 B2
(45) Date of Patent: Dec. 3, 2019

(54) SYSTEM AND METHOD FOR MAINTAINING A SMOOTHED SURFACE ON A MEMS DEVICE

(71) Applicant: Robert Bosch GmbH, Stuttgart (DE)

(72) Inventors: Jochen Stehle, Palo Alto, CA (US); Gary Yama, Mountain View, CA (US)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/066,580

(22) PCT Filed: Dec. 29, 2016

(86) PCT No.: PCT/EP2016/082803
§ 371 (c)(1),
(2) Date: Jun. 27, 2018

(87) PCT Pub. No.: WO2017/114881
PCT Pub. Date: Jul. 6, 2017

(65) Prior Publication Data
US 2018/0362338 A1      Dec. 20, 2018

Related U.S. Application Data

(60) Provisional application No. 62/273,107, filed on Dec. 30, 2015.

(51) Int. Cl.
*B81C 1/00* (2006.01)
*B81B 7/02* (2006.01)

(52) U.S. Cl.
CPC ............ *B81C 1/00333* (2013.01); *B81B 7/02* (2013.01); *B81B 2201/0242* (2013.01); *B81C 2203/0136* (2013.01); *B81C 2203/0145* (2013.01)

(58) Field of Classification Search
CPC ............................ B81C 1/00333; B81B 7/02
See application file for complete search history.

(56) References Cited

U.S. PATENT DOCUMENTS

| 7,544,531 B1 | 6/2009 | Grosjean |
| 2005/0095833 A1 | 5/2005 | Lutz et al. |
| 2009/0075415 A1 | 3/2009 | Nakamura |
| 2014/0054730 A1 | 2/2014 | Graham et al. |

OTHER PUBLICATIONS

International Search Report corresponding to PCT Application No. PCT/EP2016/082803, dated Mar. 9, 2017 (3 pages).

*Primary Examiner* — Errol V Fernandes
(74) *Attorney, Agent, or Firm* — Maginot, Moore & Beck LLP

(57) ABSTRACT

A method of fabricating a MEMS device includes performing an atomic layer deposition (ALD) process to deposit a barrier layer such as Aluminum Oxide (Al2O3) having a thickness on a sacrificial layer deposited on a substrate. A portion of the barrier layer is removed to form an etched structure defined as a trench. An epi-polysilicon cap layer is epitaxially growth on the barrier layer and the entire etched structure. A portion of the epi-polysilicon cap layer has been removed to form a plurality of openings. The sacrificial layer is etched away leaving a cavity below the etched openings. A refill epi-polysilicon layer is epitaxially grown in the openings and seals the entire openings after a gap is formed between the cap layer and the substrate.

15 Claims, 18 Drawing Sheets

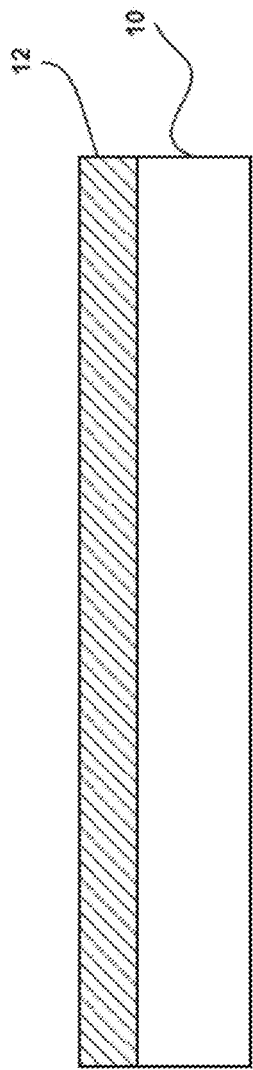
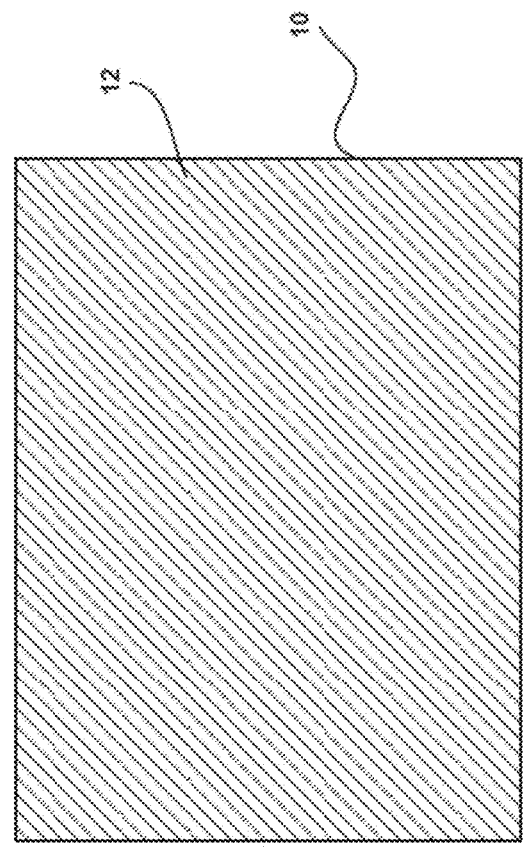

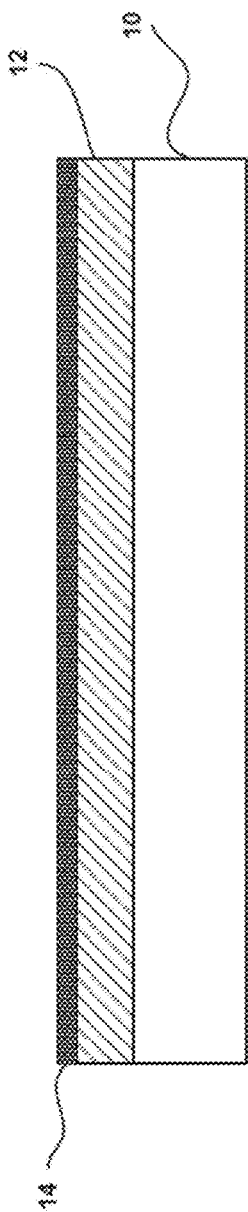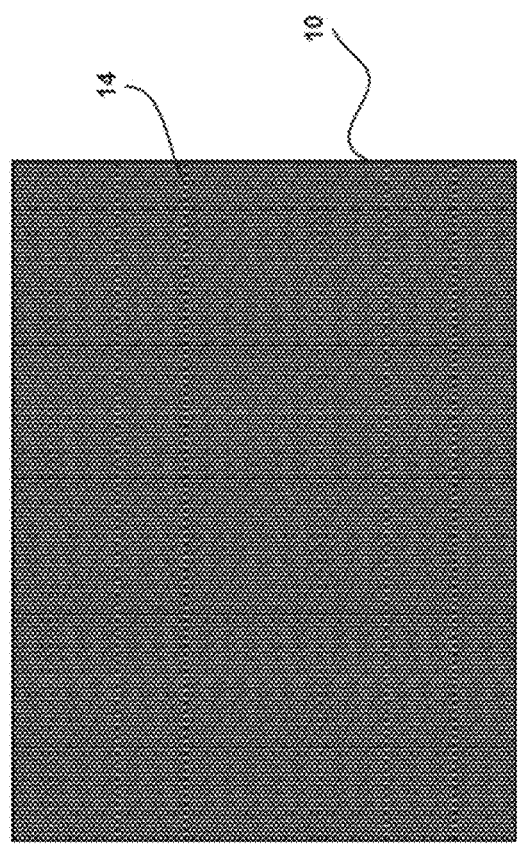
FIG. 3A
FIG. 3B

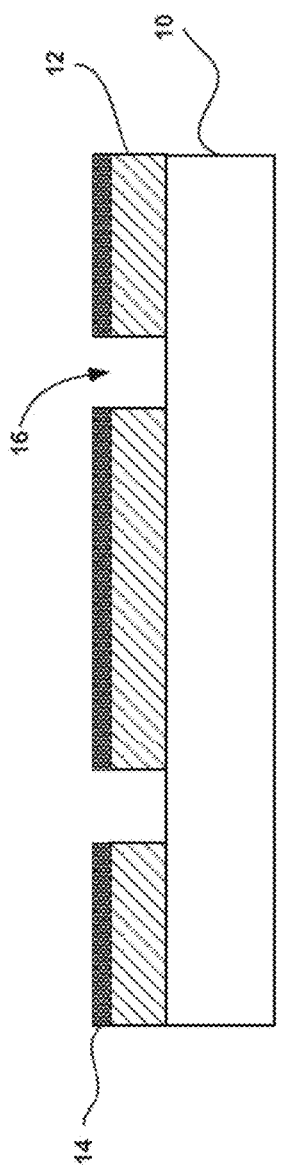
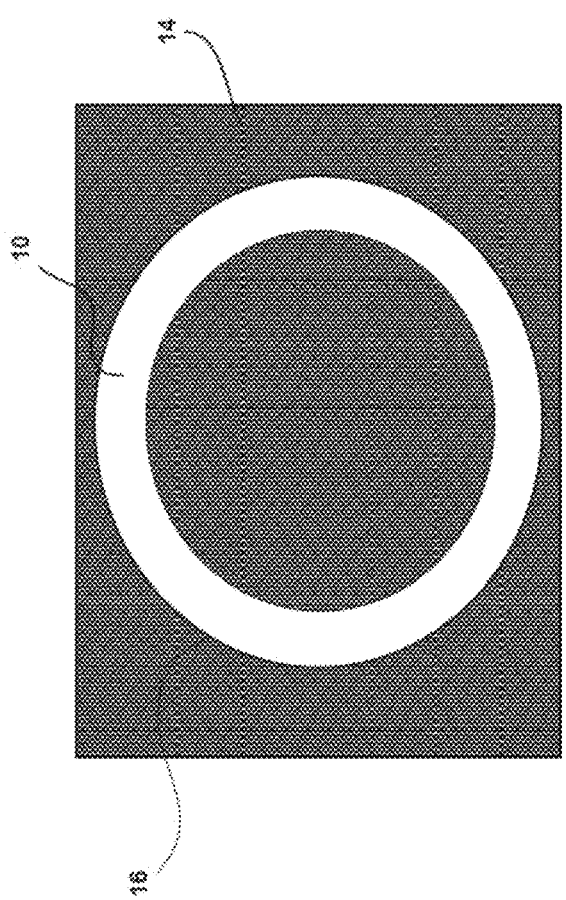
FIG. 4A
FIG. 4B

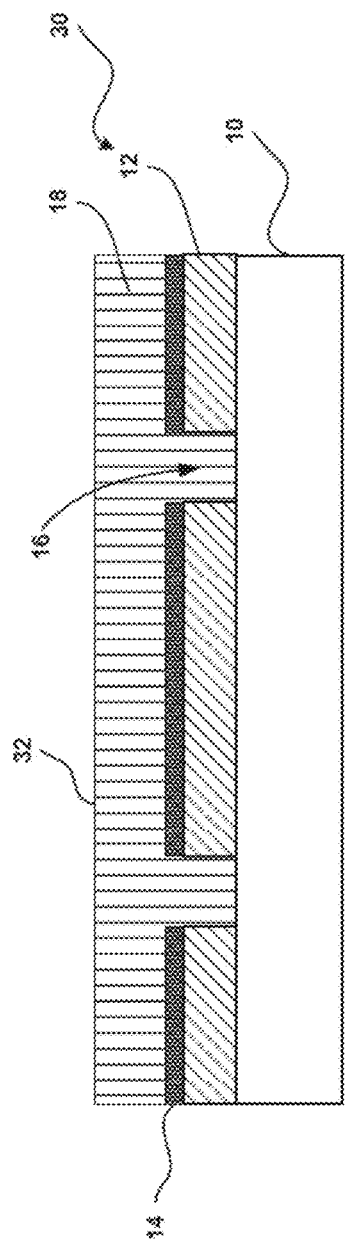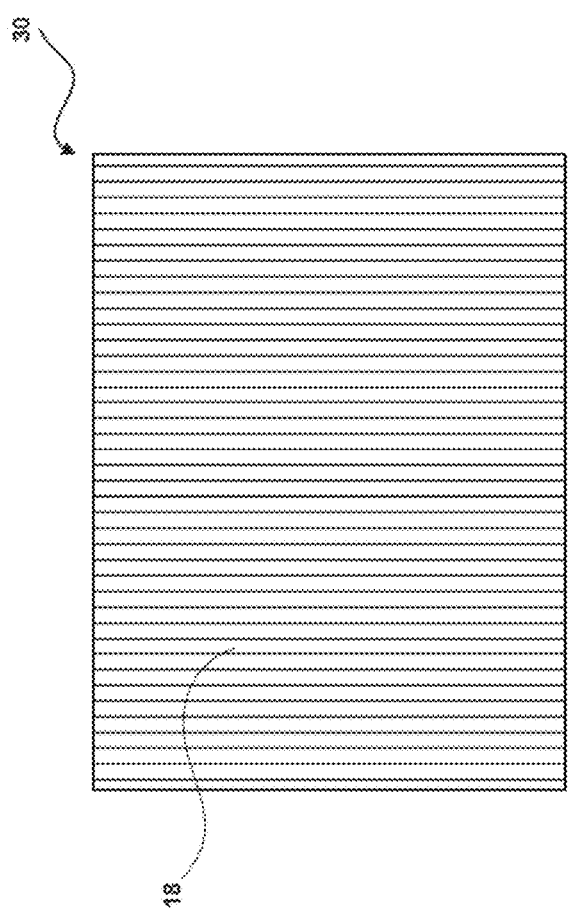
FIG. 5A
FIG. 5B

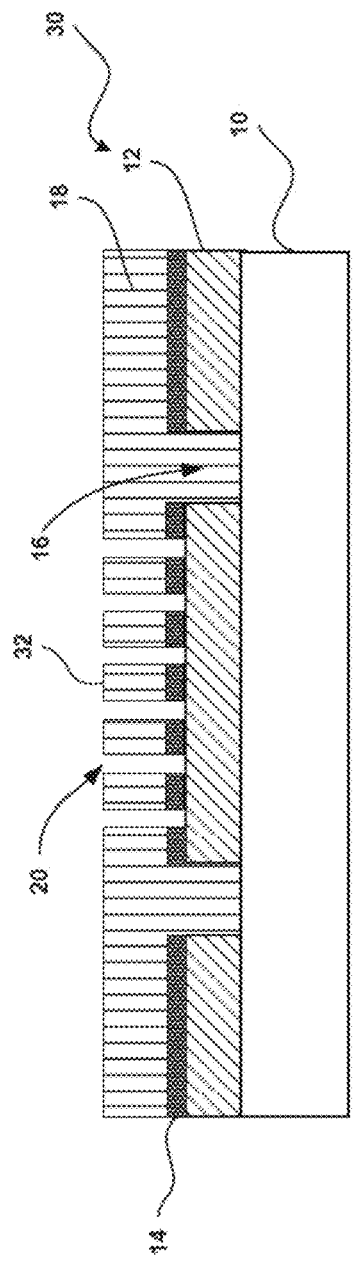
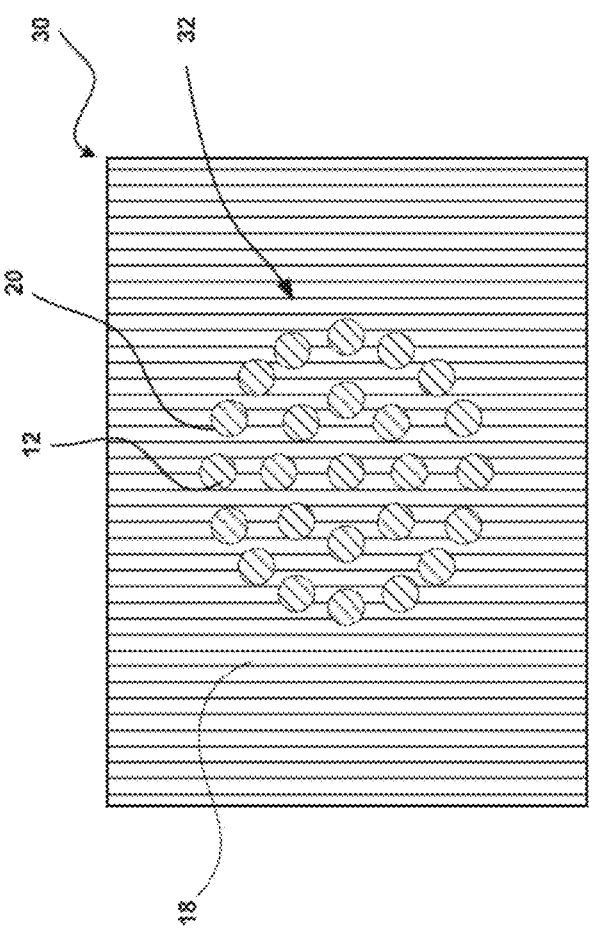
FIG. 6A
FIG. 6B

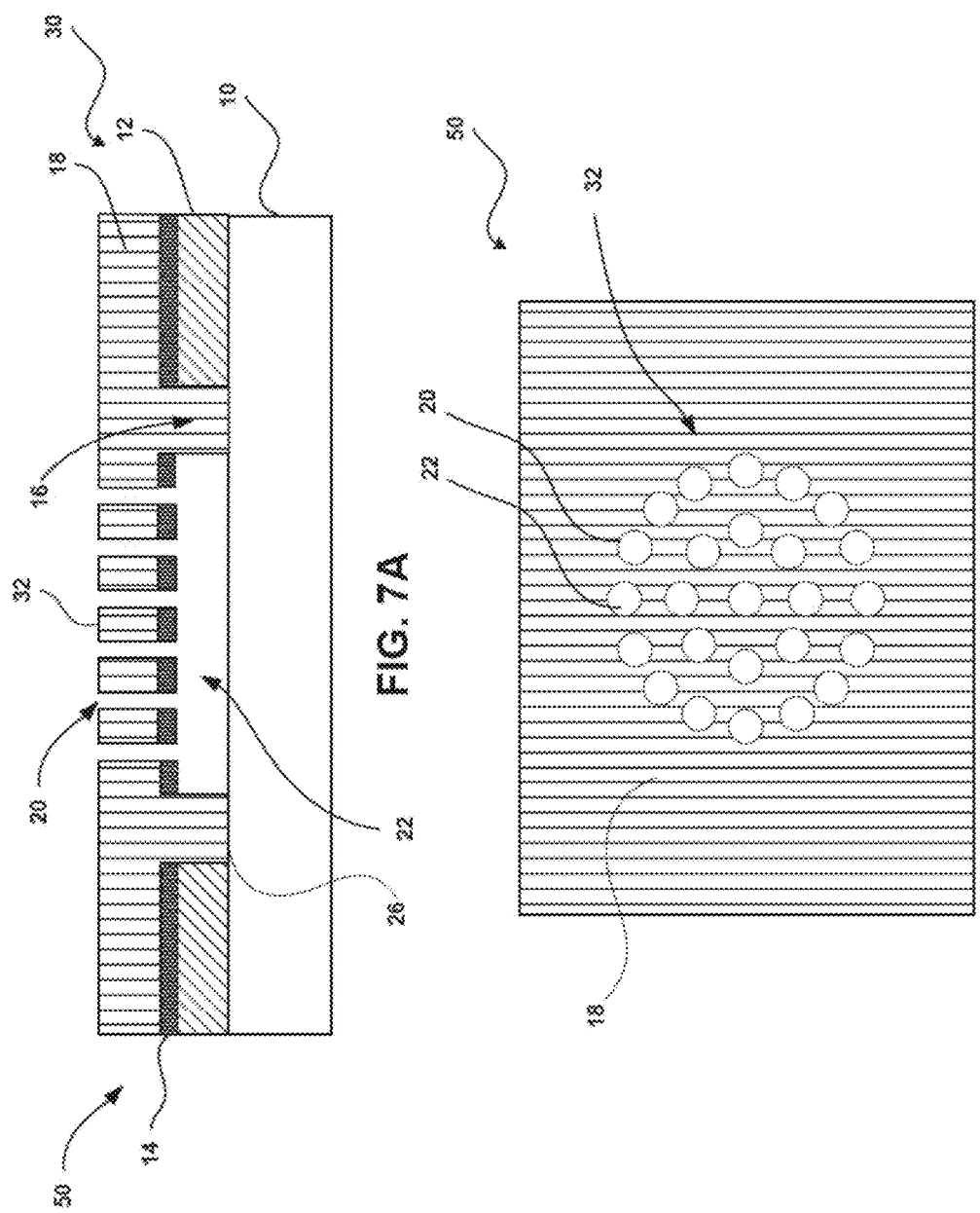

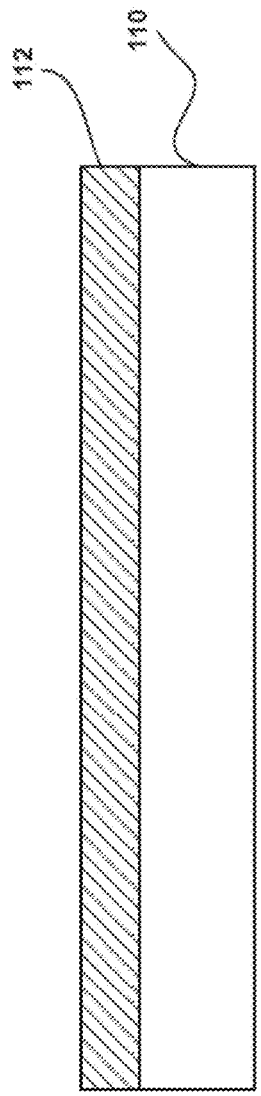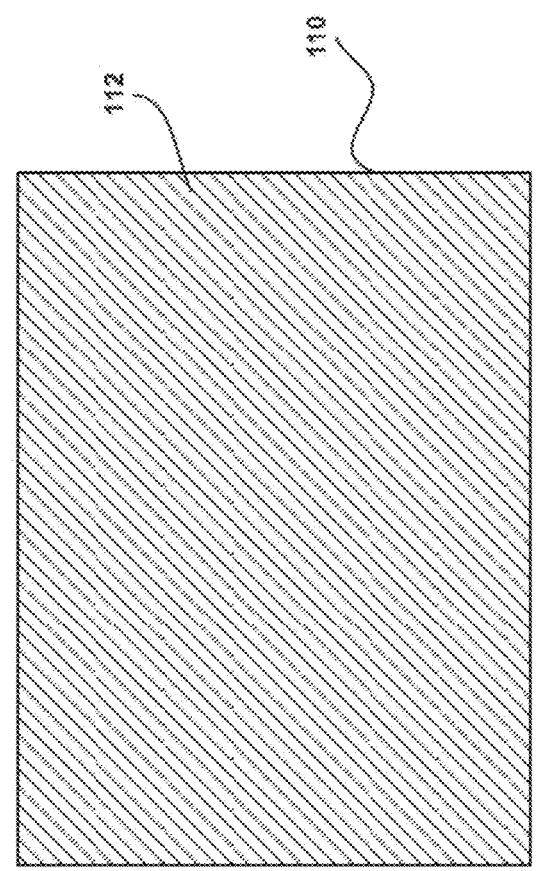

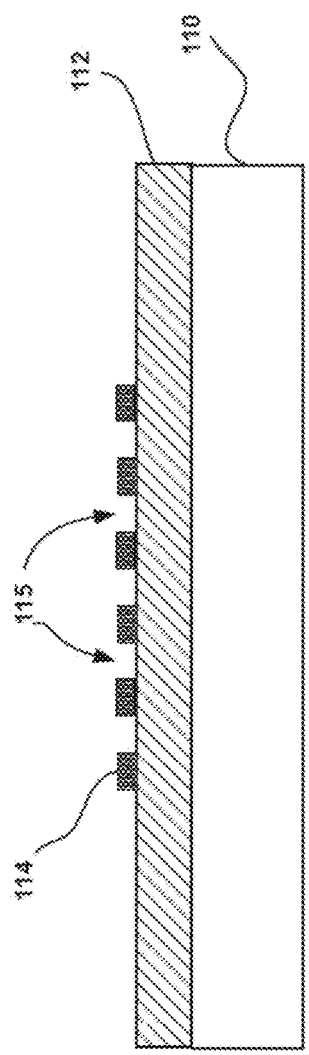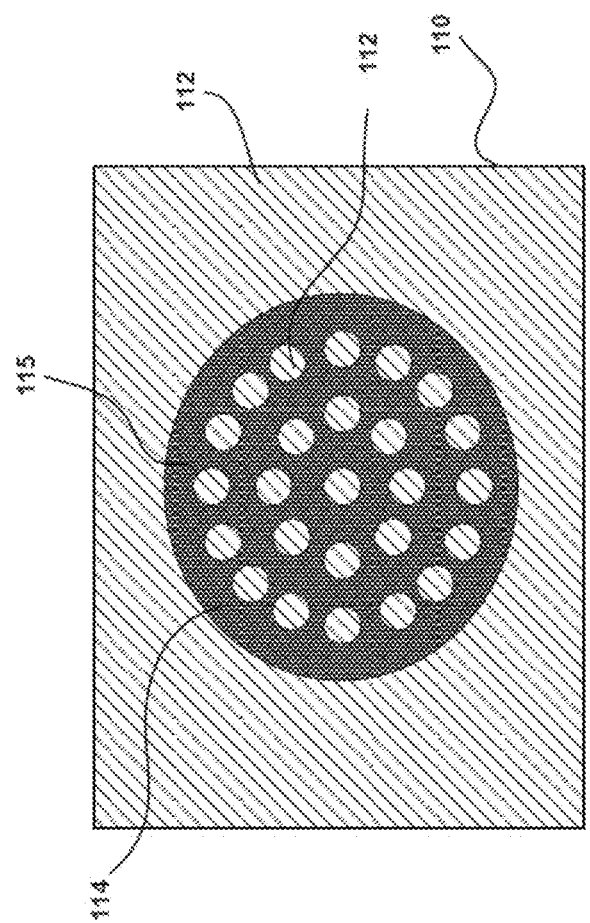

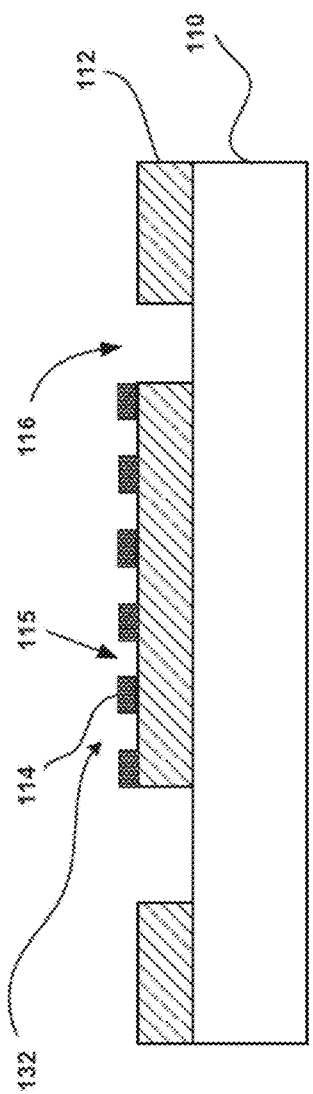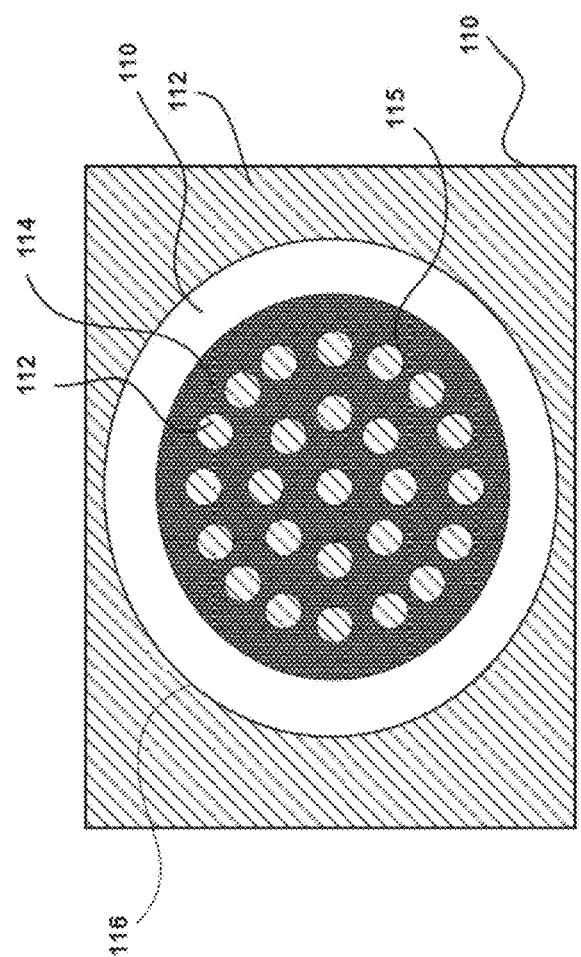
FIG. 13A
FIG. 13B

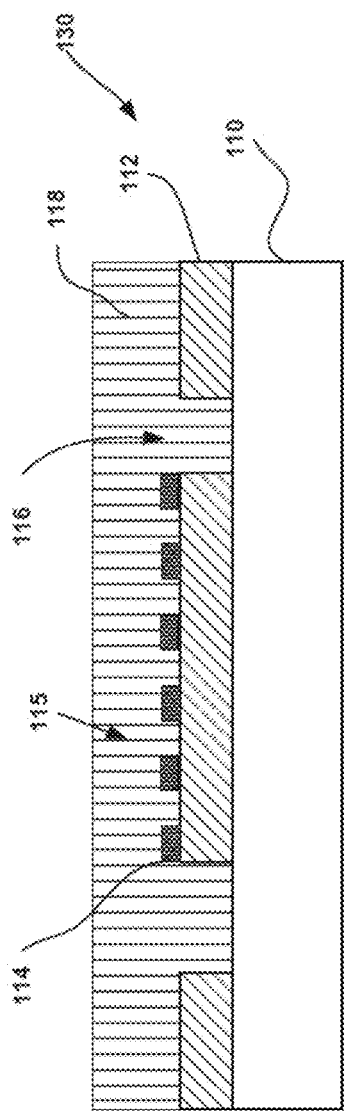
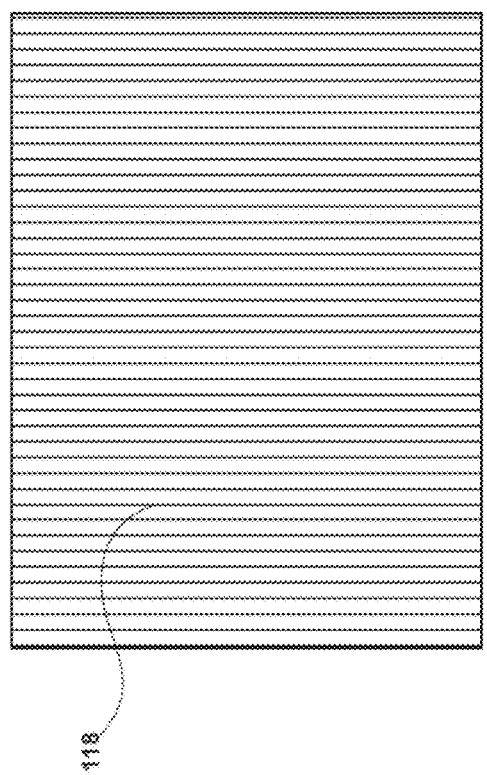
FIG. 14A
FIG. 14B

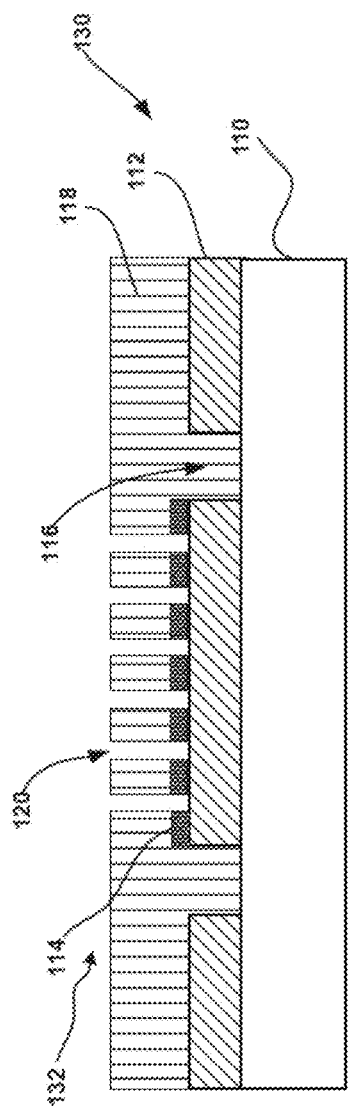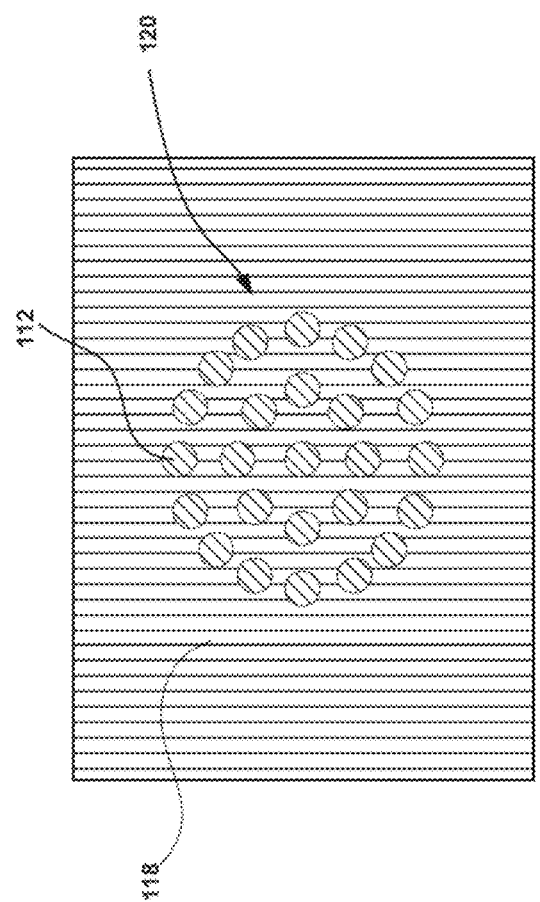

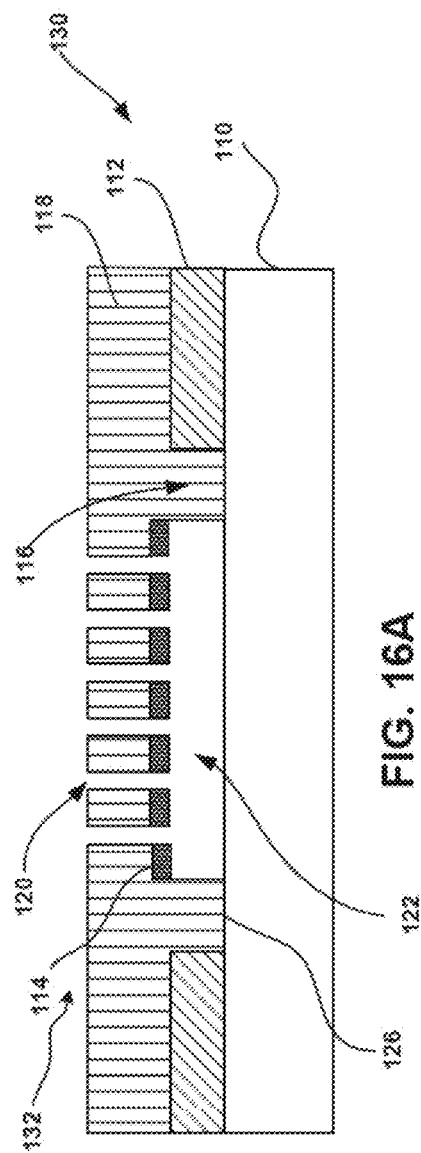
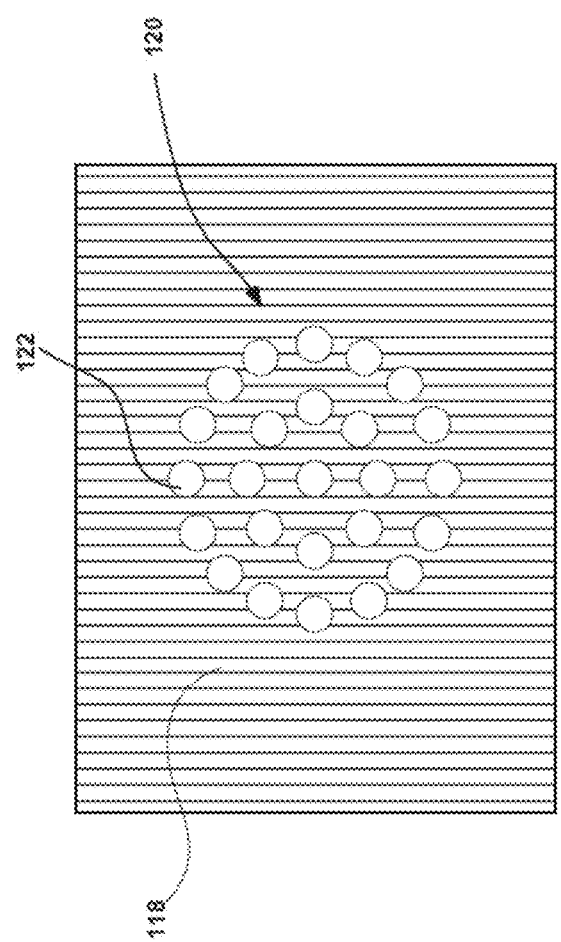
FIG. 16A
FIG. 16B

SYSTEM AND METHOD FOR MAINTAINING A SMOOTHED SURFACE ON A MEMS DEVICE

CROSS-REFERENCE TO RELATED APPLICATION

This application is a 35 U.S.C. § 371 National Stage Application of PCT/EP2016/082803, filed on Dec. 29, 2016, which claims the benefit of priority to a U.S. provisional patent application Ser. No. 62/273,107, filed Dec. 30, 2015, the contents of which are incorporated herein by reference as if fully enclosed herein.

FIELD

The patent relates generally to microelectromechanical system (MEMS) devices and, more particularly, to a MEMS device with a smoothened epi-poly cap layer.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Embodiments of the disclosure related to systems and methods for maintaining a smoothened surface on a cap layer for a MEMS device. For example, a device includes a substrate and a barrier layer deposited on the substrate. The bather layer can be Aluminum Oxide ($Al_2O_3$) with a thickness. A sacrificial layer may be deposited on the substrate before depositing the barrier layer. An etched structure is formed in portions of the sacrificial and barrier layer during an etching process. A material such as a polysilicon layer is epitaxially grown in the etched structure and on the barrier layer, defines a cap layer. The device further undergoes another etching process by removing portions of the epi-polysilicon layer and the barrier layer until the surface of the sacrificial layer is exposed to form openings. A refill material layer is epitaxially grown in the openings until the openings are sealed with the refill material. The refill material may be the same material as used as the cap layer material. In alternate embodiment, the refill material may be a different material from the cap layer material. A substantially smoothened surface opposed to the substrate is maintained on the cap layer that has a reduced surface roughness. The use of the barrier layer prevents the polysilicon on the underside of the cap layer from migrating and forming a rough surface.

According to another exemplary embodiment of the disclosure, a MEMS device includes a substrate and a barrier layer deposited on the substrate. The barrier layer can be Aluminum Oxide ($Al_2O_3$) with a thickness. A sacrificial layer may be deposited on the substrate before depositing the barrier layer. A plurality of trenches, illustrated as circular shape trenches, are formed within a portion of the barrier layer, during an etching process. The substrate continues to undergo a new patterning step forming a second trench surrounding the circular patterned trenches etched into the barrier layer. The etching process continues until a portion of the sacrificial layer is etched to expose a surface of the substrate and thereby a deep trench is formed. A material such as a polysilicon layer is epitaxially grown in the trenches and on the sacrificial layer, defines a cap layer. The device further undergoes another etching process by removing the epi-polysilicon layer within the plurality of trenches until a surface of the sacrificial layer below the trenches is exposed to form openings. Vapor hydrofluoric acid (vHF) is used to remove the sacrificial layer under the plurality of holes, forming a gap. A refill material layer is epitaxially grown in the openings until the openings are sealed with the refill material. The use of the barrier layer prevents the polysilicon on the underside of the cap layer from migrating and forming a rough surface. The resulting MEMS device has a reduced surface roughness formed on the cap and refill epi-polysilicon layers.

BRIEF DESCRIPTION OF THE DRAWINGS

These and other features, aspects, and advantages of this disclosure will become better understood when the following detailed description of certain exemplary embodiments is read with reference to the accompanying drawings in which like characters represent like arts throughout the drawings, wherein:

FIG. 2A is a cross sectional view of an embodiment of a substrate for implementing a MEMS sensor after a deposition of a sacrificial layer in accordance with a described disclosure;

FIG. 2B is a top view of the substrate of FIG. 2A covered with the sacrificial layer;

FIG. 3A is a cross sectional view of the substrate of FIGS. 2A and 2B after a deposition of a barrier layer;

FIG. 3B is a top view of the substrate of FIG. 3A covered with the barrier layer;

FIG. 4A is a cross sectional view of the substrate of FIGS. 3A and 3B after portions of the sacrificial layer and the bather layer have been etched to form a structure defining a trench;

FIG. 4B is a top view of the substrate of FIG. 4A with an etched structure formed in the sacrificial layer and the barrier layer;

FIG. 5A is a cross sectional view of the substrate of FIGS. 4A and 4B after an epitaxial deposition of polysilicon material to cover the bather layer and fill the etched structure that forms a membrane;

FIG. 5B is a top view of the substrate of FIG. 5A with the polysilicon material covering the bather layer and filling the etched structure that forms the membrane;

FIG. 6A is a cross sectional view of the substrate of FIGS. 5A and 5B after portions of the epi-poly cap layer and bather layer have been etched to form access openings;

FIG. 6B is a top view of the substrate of FIG. 6A with access openings formed in the epi-poly cap layer and the bather layer using a deep reactive ion etching (DRIE) process;

FIG. 7A is a cross sectional view of the substrate of FIGS. 6A and 6B after portions of the sacrificial layer have been etched to form a cavity between the bather layer and the substrate and to release a membrane;

FIG. 7B is a top view of the substrate of FIG. 7A with the membrane suspended above the substrate after the cavity between the bather layer and the substrate is release using an etching process;

FIG. 10A is a cross sectional view of another described example of a MEMS sensor including a sacrificial layer deposited on a substrate in accordance with a described disclosure;

FIG. 10B is a top view of the substrate of FIG. 10A covered with the sacrificial layer;

FIG. 12A is a cross sectional view of the substrate of FIG. 11A after a portion of the barrier layer has been etched to form a plurality of trenches;

FIG. 12B is a top view of the substrate of FIG. 12A with the trenches formed in the barrier layer;

FIG. 13A is a cross section view of substrate of FIG. 12A after a portion of the sacrificial layer has been etched to form a deep trench;

FIG. 13B is a top view of the substrate of FIG. 13A with the deep trench formed in the sacrificial layer;

FIG. 14A is a cross sectional view of the substrate of FIG. 13A after an epitaxial deposition of polysilicon material to cover the sacrificial layer and fill the trenches;

FIG. 14B is a top view of the substrate of FIG. 14A with the polysilicon material covering the sacrificial layer and filling the trenches;

FIG. 15A is a cross sectional view of the substrate of FIG. 14A after a portion of the cap layer and the trenches above the sacrificial layer have been etched to form access openings;

FIG. 15B is a top view of the substrate of FIG. 15A with access openings formed in the cap layer material and the trenches above the sacrificial layer using a deep reactive ion etching (DRIE) process;

FIG. 16A is a cross sectional view of the substrate of FIG. 15A after a portion of the sacrificial layer below the access openings has been etched to form a cavity and to release a membrane;

FIG. 16B is a top view of the substrate of FIG. 16A with the membrane suspended above the substrate after the cavity between the openings and the substrate is formed using an etching process.

DETAILED DESCRIPTION

The following description is presented to enable any person skilled in the art to make and use the described embodiments, and is provided in the context of a particular application and its requirements. Various modifications to the described embodiments will be readily apparent to those skilled in the art, and the general principles defined herein may be applied to other embodiments and applications without departing from the spirit and scope of the described embodiments. Thus, the described embodiments are not limited to the embodiments shown, but are to be accorded the widest scope consistent with the principles and features disclosed herein.

Figure 1:
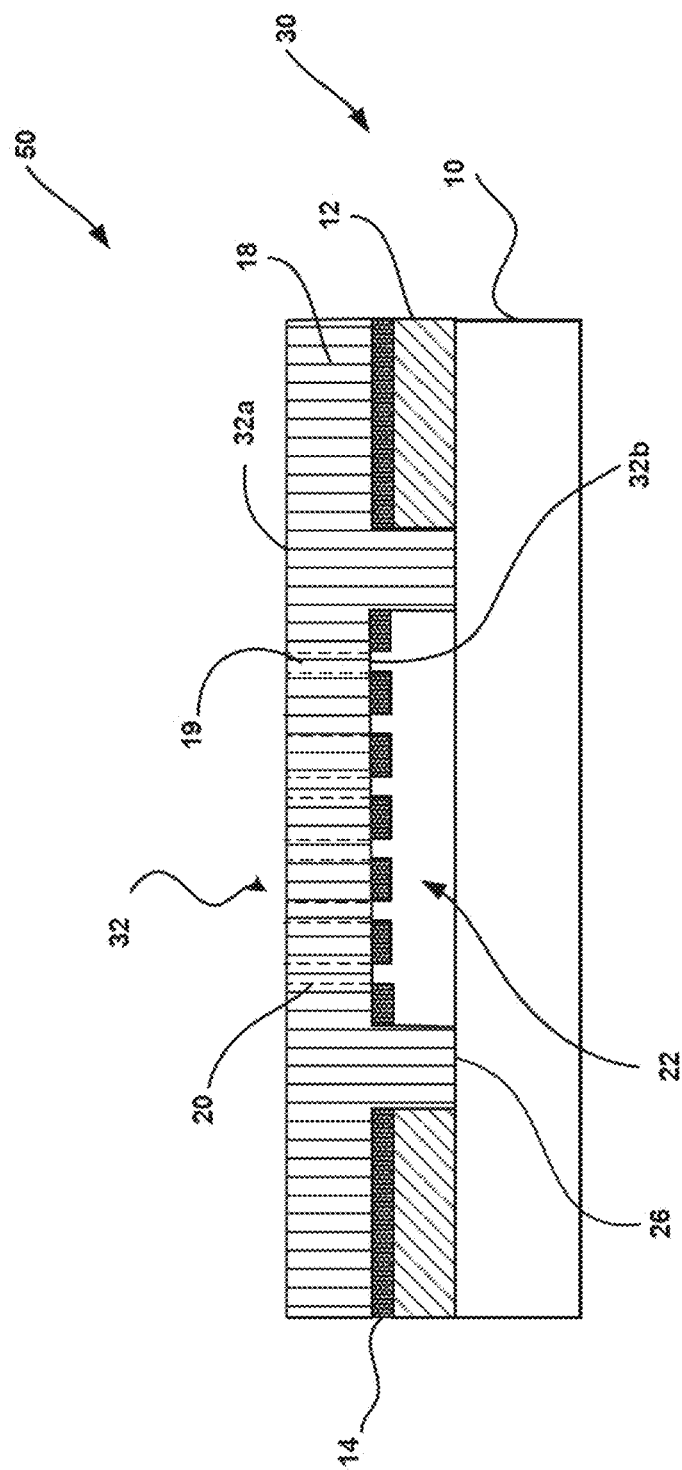
FIG. 1 is a cross sectional view of an exemplary embodiment of a MEMS device with a smoothened surface in accordance with a disclosure.

FIG. 1 depicts an exemplary embodiment of a MEMS device 50 in accordance with the teachings of the disclosure. The device 50 includes a substrate 10, an epi-poly cap layer 30, and a barrier layer 14. The substrate 10 comprises a silicon substrate or a silicon wafer. In alternate embodiments, the substrate 10 may comprise a silicon on insulator (SOI) substrate or oxidized substrate. The substrate 10 has a thickness between about 400 and 700 microns, but can be more or less, depending on the application. The barrier layer 14 is formed between the substrate 10 and the epi-poly cap layer 30 using atomic layer deposition (ALD). The barrier layer 14 may be non-porous Aluminum Oxide ($Al_2O_3$) and is typically 20 nm in thickness, but can be more or less, depending on the application. The epi-poly cap layer 30 is mounted on the substrate 10 by support structures 26 to form a gap or cavity 22 between the epi-poly cap layer 30 and the substrate 10. The epi-poly cap layer 30 comprises an epitaxial deposition of polysilicon 18 that forms a flexible membrane 32 suspended above the substrate 10 by the support structures 26. The flexible membrane 32 includes a first surface 32a and a second surface 32b. The first surface 32a faces away from the substrate 10 and the second surface 32b faces toward the substrate 10 and the bather layer 14. The second surface 32b and the barrier layer 14 define a portion of the cavity 22. A sacrificial layer 12 is deposited on the substrate 10 using any conventional deposition techniques. The sacrificial layer 12 may be silicon dioxide ($SiO_2$) and is typically between about 0.5 micron and 2.0 microns in thickness, but can be more or less, depending on the application. The epi-poly cap layer 30 is deposited onto at least one of the bather layer 14 and the sacrificial layer 12 which is then removed via access openings 20 (depicted in dashed lines) to expose the cavity 22 and release the membrane 32. The access openings 20 formed within the epi-poly cap layer 30 is sealed to close and seal the cavity 22. Additional access openings formed through the cap layer 30 and the bather layer 14 at any location adjacent to the membrane 32 also provide access to the sacrificial layer for the introduction of an etchant material.

As discussed below, the barrier layer 14 are deposited on the sacrificial layer 12 using ALD which prevents an epitaxial deposition of polysilicon 19 within the access openings 20 from migrating and forming a rough surface on the second surface 32b of the membrane 32 after the cavity 22 is formed. The MEMS device 50, depicted in FIG. 1, results in an epi-poly cap layer 30 includes a smoothed surface roughness formed on the second surface 32b of the membrane 32.

A process for fabricating a MEMS device 50 having a smoothed surface formed on an epi-poly cap layer 30 will now be described with reference to FIGS. 2-8. As depicted in FIG. 2A, a sacrificial layer 12 is deposited on a substrate 10 using any conventional deposition techniques. The sacrificial layer 12 may be silicon dioxide ($SiO_2$) and is typically between about 0.5 micron and 2.0 microns in thickness, but can be more or less, depending on the application. The substrate 10 may be a portion of a larger substrate that is used to form a number of MEMS devices. The substrate 10 comprises a silicon substrate or a silicon wafer. In alternate embodiments, the substrate 10 may comprise a silicon on insulator (SOI) substrate or oxidized substrate. The substrate 10 has a thickness between about 400 and 700 microns, but can be more or less, depending on the application. As shown in FIG. 2B, the substrate 10 is covered with the sacrificial layer 12.

A bather layer 14 is deposited on the sacrificial layer 12 using atomic layer deposition (ALD), as depicted in FIG.

3A. The bather layer 14 may be non-porous Aluminum Oxide ($Al_2O_3$) and is typically 20 nm in thickness, but can be more or less, depending on the application. The thickness of the barrier layer 14 deposited on the sacrificial layer 12 can be precisely controlled via the ALD process. In alternate embodiments, the barrier layer 14 may comprise materials with characteristics that are resistant to vapor hydrofluoric (vHF) acid during the fabrication process at an elevated high temperature. In one embodiment, the temperature may be at least 850° C. The alternate materials that withstand high temperature during epitaxial growth process may also be used as a bather layer. FIG. 3B illustrates a top view of the substrate 10 covered by the barrier layer 14.

Referring to FIG. 4A, portions of the sacrificial layer 12 and the bather layer 14 are etched using an etching technique until a surface of the substrate 10 is exposed to form a trench 16. The etching technique may be any standard semiconductor process, such as wet or dry etching, by laser etching, depending in part upon the nature of the application.

FIG. 4B illustrates a top view of the substrate 10 with an etched structure defined by a trench 16 formed in the sacrificial layer 12 and the barrier layer 14 after an etching process. The trench 16 may be circular, rectangular, oval, square, or any other suitable shape. As one example, the trench 16 is round.

Once the portions of the sacrificial layer 12 and the barrier layer 14 are removed to form the etched structure 16, the substrate 10 is placed in an epitaxial reactor for epitaxial growth. As shown in FIG. 5A, a material 18 such as a polysilicon layer grows epitaxially over the barrier layer 14 and fill the entire area of the trench 16 which defines an epi-poly cap layer 30. In alternate embodiment, the material 18 may be doped or undoped polysilicon. The thickness and the doping concentrations of the epitaxial layer are determined by the type of application. In one embodiment, the epi-polysilicon cap layer 30 is typically 10 micron in thickness, but can be more or less, depending on the application. The material 18 formed within the trench 16 supports the epi-poly cap layer 30 after the epi-poly cap layer is formed and releases a membrane 32 which will be described below.

FIG. 5B illustrates a top view of the substrate 10 with a polysilicon layer 18 epitaxially grown over the barrier layer 14 and the etched structure 16.

An etching process such as deep reactive ion etching (DRIE) is used to remove portions of the epi-poly cap layer 30 and the barrier layer 14 down to the sacrificial layer 12 is exposed to form a plurality of access openings 20. As depicted in FIG. 6A, the access openings 20 is formed through the membrane 32 of the epi-poly cap layer 30 and the bather layer 14 to provide access to the sacrificial layer 12 for the introduction of an etchant material. FIG. 6B illustrates a top view of the substrate 10 with a plurality of access openings 20 formed though the membrane 32 of the epi-poly cap layer 30 and the bather layer 14 down to the sacrificial layer 12.

The substrate 10 continues to undergo an etching process. As depicted in FIG. 7A, a vHF acid is introduced via the access opening 20 formed within the epi-poly cap layer 30 to dissolve a portion of the sacrificial layer 12 beneath the access opening 20 until a cavity 22 is formed between the substrate 10 and the barrier layer 14 and release the membrane 32. The membrane 32 of the epi-poly cap layer 30 and the barrier layer 14 suspended above the substrate 10 are supported by support structures 26 formed by the trench 16 filled with polysilicon material 18. In alternate embodiments, the cavity 22 may be in proximal to the openings 20. FIG. 6B illustrates a top view of the substrate 10 with the cavity 22 formed after the etching process.

Figure 7C:
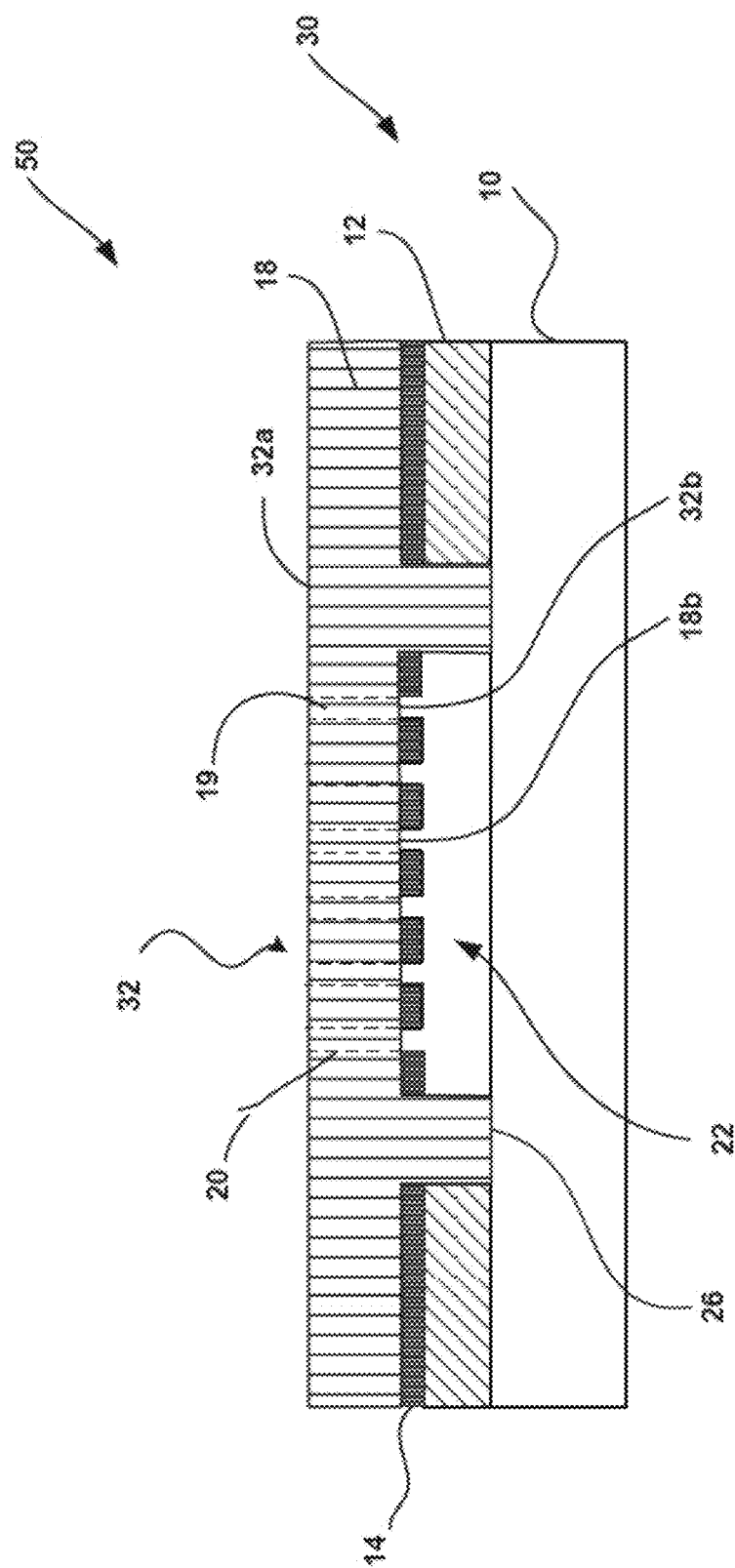
FIG. 7C is a cross sectional view of the substrate of FIG. 7A after an epitaxial deposition of a refill material in the access openings to reseal the access openings.

The substrate 10 is then placed in the epitaxial reactor again for epitaxial growth. During this process, a refill material 19 grows epitaxially in the access openings 20 (depicted in dashed lines) as depicted in FIG. 7C. In one embodiment, the refill material 19 may be polysilicon layer. In an alternate embodiment, the refill material 19 grown in the access openings 20 may be different from the cap layer material 18 grown on the bather layer 14. As shown in FIG. 7C, the epi-polysilicon 19 is grown in and closes the access openings 20. The flexible membrane 32 includes a first surface 32a and a second surface 32b. The first surface 32a faces away from the substrate 10 and the second surface 32b faces toward the substrate 10 and the bather layer 14. The second surface 32b and the bather layer 14 define a portion of the cavity 22. The use of the barrier layer 14 during the etching process prevents the silicon on the underside of the epi-polysilicon layers 18, 19 from migrating and forming a rough surface on the second surface 18b of the epi-polysilicon layers 18, 19. The resulting MEMS device has a reduced surface roughness formed on the epi-poly cap layer 30.

Figure 8:
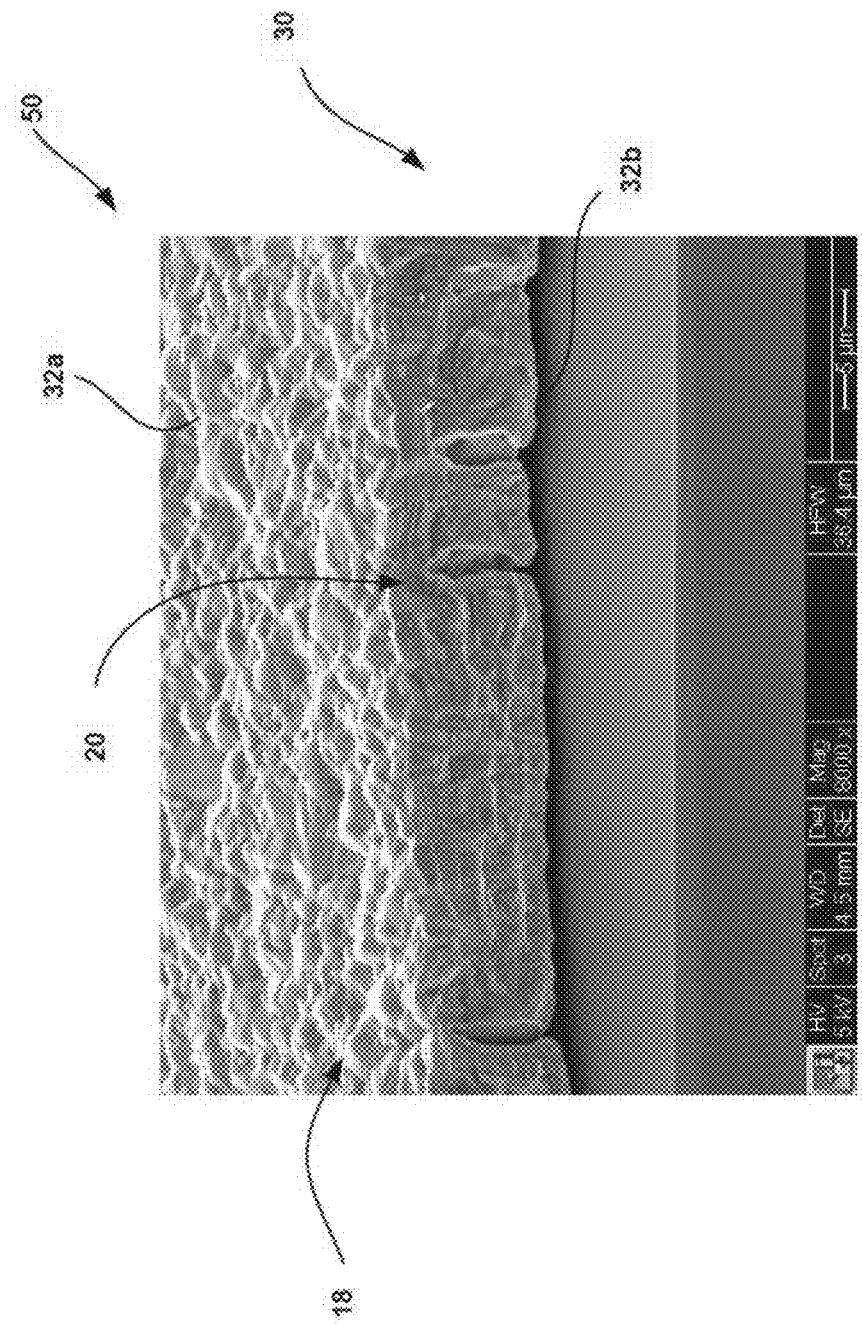
FIG. 8 depicts a scanning electron microscope (SEM) microphotograph of a MEMS device which may be formed in accordance with the principles of the disclosure discussed with reference to FIGS. 1-7.

A scanning electron microscope (SEM) microphotograph of a portion of the MEMS device 50 formed in accordance with the process described above with respect to FIGS. 2-7 is depicted in FIG. 8. The membrane 32 of the epi-poly cap layer 30 is formed and suspended over the substrate 10. The membrane 32 includes a first surface 32a and a second surface 32b. The second surface 32b proximal to the cavity 22 faces toward the substrate 10. Access openings 20 formed through the epi-poly cap layer 30 to provide access to the sacrificial layer 12 for the introduction of an etchant in order to release the membrane 32 are then sealed and filled the access openings 20 with the refill epi-poly 19. In doing so, the second surface 32b is substantially smoother.

Figure 9:
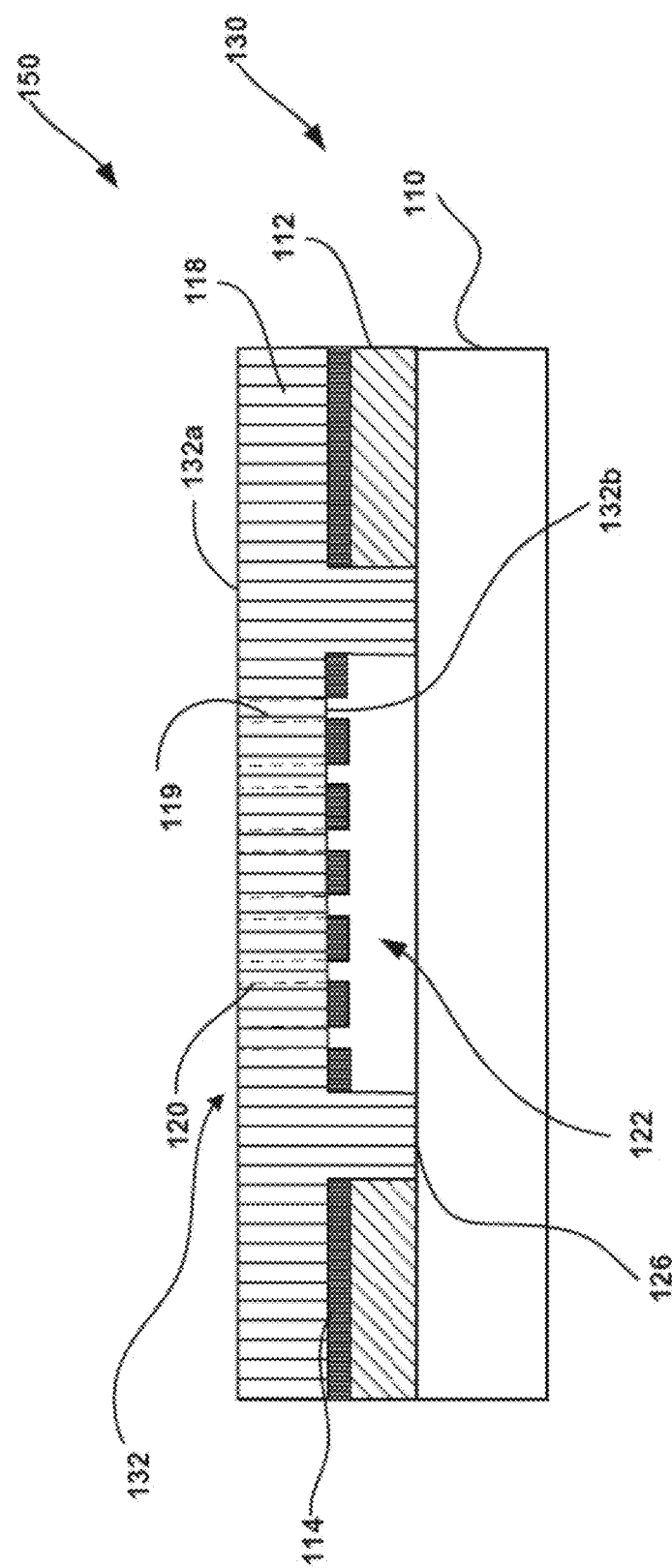
FIG. 9 is a cross sectional view of another described embodiment of a MEMS device with a smoothened surface in accordance with a disclosure.

FIG. 9 depicts another described embodiment of a MEMS device 150 in accordance with the teachings of the disclosure. FIG. 9 is similar in construction to the MEMS sensor in FIG. 1 and like elements are identified with a like reference convention wherein, for example, element 10 corresponds to element 110. The device 150 includes a substrate 110, an epi-poly cap layer 130, and a bather layer 114. The substrate 110 comprises a silicon substrate or a silicon wafer. In alternate embodiments, the substrate 110 may comprise a silicon on insulator (SOI) substrate or oxidized substrate. The substrate 110 has a thickness between about 400 and 700 microns, but can be more or less, depending on the application. The barrier layer 114 is formed between the substrate 110 and the epi-poly cap layer 130 using atomic layer deposition (ALD). The bather layer 114 may be non-porous Aluminum Oxide ($Al_2O_3$) and is typically 20 nm in thickness, but can be more or less, depending on the application. The epi-poly cap layer 130 is mounted on the substrate 110 by support structures 126 to form a gap or cavity 122 between the epi-poly cap layer 130 and the substrate 110. The epi-poly cap layer 130 comprises an epitaxial deposition of polysilicon 118 that forms a flexible membrane 132 suspended above the substrate 110 by the support structures 126. The flexible membrane 132 includes a first surface 132a and a second surface 132b. The first surface 132a faces away from the substrate 110 and the second surface 132b faces toward the substrate 110 and the bather layer 114. The second surface 132b and the bather layer 114 define a portion of the cavity 122.

A sacrificial layer 112 is deposited on the substrate 110 using any conventional deposition techniques. The sacrificial layer 112 may be silicon dioxide ($SiO_2$) and is typically between about 0.5 micron and 2.0 microns in thickness, but can be more or less, depending on the application. The epi-poly cap layer 130 is deposited onto at least one of the bather layer 114 and the sacrificial layer 112 which is then removed via access openings 120 (depicted in dashed lines) to expose the cavity 122 and release the membrane 132. The access openings 120 formed within the epi-poly cap layer 130 is sealed to close and seal the cavity 122. Additional access openings formed through the cap layer 130 and the barrier layer 114 at any location adjacent to the membrane 132 also provide access to the sacrificial layer for the introduction of an etchant material. Unlike from the MEMS device 50 where the access openings 20 are formed through the epi-poly cap layer 30 and the barrier layer 14 after an epitaxial deposition of polysilicon 18 on the barrier layer 14 that forms the membrane 32. The access openings 120 of the MEMS device 150 as depicted in FIG. 9 are formed through the bather layer 114 using an etching technique before an epitaxial deposition of polysilicon 118 on the bather layer 114.

As discussed below, the bather layer 114 are deposited on the sacrificial layer 112 using ALD which prevents an epitaxial deposition of polysilicon 118 within the access openings 120 from migrating and forming a rough surface on the second surface 132b of the membrane 132. The MEMS device 150, depicted in FIG. 9, results in an epi-poly cap layer 130 includes a smoothed surface roughness formed on the second surface 132b of the membrane 132.

A process for fabricating a MEMS device 150 having a smoothed surface formed on an epi-poly cap layer 130 will now be described with reference to FIGS. 10-16. As illustrated in FIG. 10A, the substrate 110 is provided as a base of the MEMS sensor. The substrate 110 may be a portion of a larger substrate that is used to form a number of MEMS devices. The substrate 110 comprises a silicon substrate or a silicon wafer. In alternate embodiments, the substrate 110 may comprise a silicon on insulator (SOI) substrate or oxidized substrate. The substrate 110 has a thickness between about 400 and 700 microns, but can be more or less, depending on the application. A sacrificial layer 112 is deposited on the substrate 110 using any conventional deposition techniques. The sacrificial layer 112 may be silicon dioxide ($SiO_2$) and is typically between about 0.5 micron and 2.0 microns in thickness, but can be more or less, depending on the application. As shown in FIG. 10B, the substrate 110 is covered with the sacrificial layer 112.

Figure 11A:
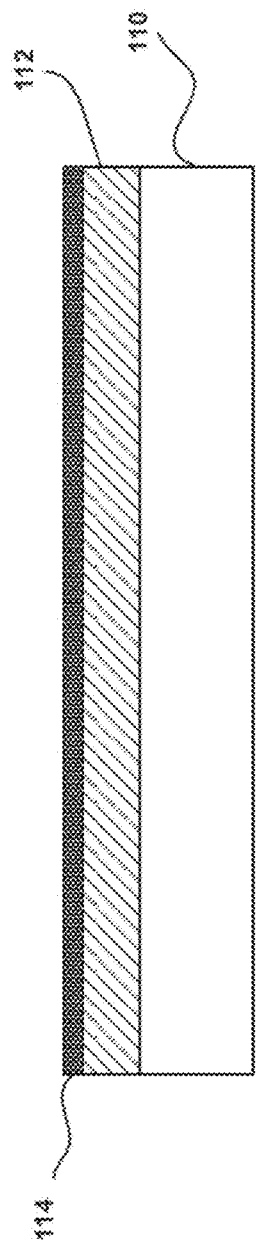
FIG. 11A is a cross sectional view of the substrate of FIG. 10A after a deposition of a barrier layer.
Figure 11B:
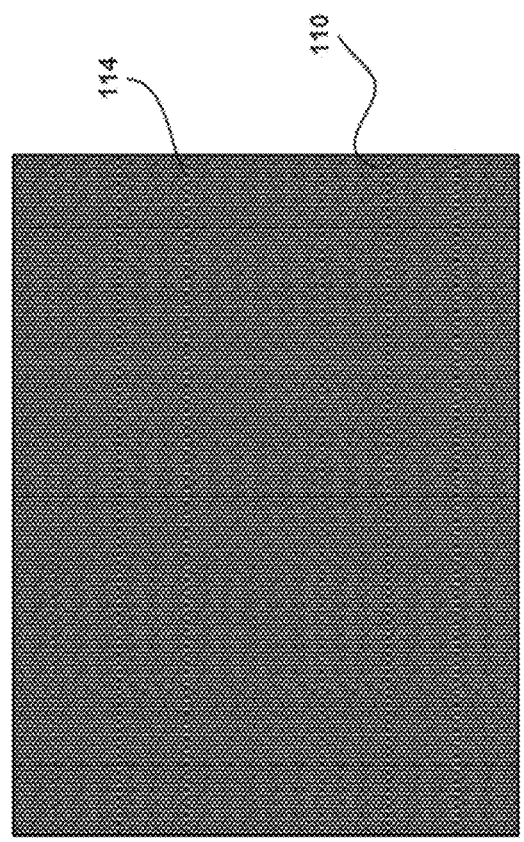
FIG. 11B is a top view of the substrate of FIG. 11A covered with the barrier layer.

A bather layer 114 is deposited on the sacrificial layer 112 using atomic layer deposition (ALD), as depicted in FIG. 11A. The bather layer 114 may be non-porous Aluminum Oxide ($Al_2O_3$) and is typically 20 nm in thickness, but can be more or less, depending on the application. The thickness of the bather layer 114 deposited on the sacrificial layer 112 can be precisely controlled via the ALD process. In alternate embodiments, the bather layer 114 may comprise materials with characteristics that are resistant to vapor hydrofluoric (vHF) acid during the fabrication process at an elevated high temperature. In one embodiment, the temperature may be at least 850° C. The alternate materials that withstand high temperature during epitaxial growth process may also be used as a bather layer. FIG. 11B illustrates a top view of the substrate 110 covered by the barrier layer 114.

FIG. 12A illustrates a cross sectional view of the substrate 110 after etching. A majority portion of the bather layer 114 is etched using an etching technique until a surface of the sacrificial layer 112 is exposed to form a trench 115, a plurality of trenches are illustrated. The etching technique may be any standard semiconductor process, such as wet or dry etching, by laser etching, depending in part upon the nature of the application.

FIG. 12B illustrates a top view of the substrate 110 with an etched structure defined by the trenches 115 formed in the barrier layer 114 after an etching process. The trenches 115 may be circular, rectangular, oval, square, or any other suitable shape. As one example, the trenches 115 are circular.

The substrate continues to undergo a new patterning step forming a second trench 116 surrounding the circular patterned trenches 115 etched into the barrier layer. The etching process continues until a portion of the sacrificial layer 112 is etched to expose a surface of the substrate 110 so that a deep trench 116 is formed. The deep trench 116 as illustrated in FIGS. 13A and 13B surrounds the trenches 115 and a membrane 132 is defined.

The substrate 110 is then placed in an epitaxial reactor for epitaxial growth, as depicted in FIGS. 14A and 14B. A material 118 such as a polysilicon layer grows epitaxially over the sacrificial layer 112 and the trenches 115, 116 which defines an epi-poly cap layer 130. In alternate embodiment, the material 118 may be doped or undoped polysilicon. The thickness and the doping concentrations of the epitaxial layer are determined by the type of application. The trench 116 filed with the material 118 supports the epi-poly cap layer 130 after the membrane 132 is released. In one embodiment, the epi-polysilicon cap layer 130 is typically 10 micron in thickness, but can be more or less, depending on the application. FIG. 14B illustrates a top view of the substrate 110 with a polysilicon layer 118 epitaxially grown over the sacrificial layer 112 and the trenches 115, 116.

A plurality of access openings 120 are illustrated in FIGS. 15A and 15B. An etching process such as deep reactive ion etching (DRIE) is used to remove portions of the cap epi-poly cap layer 130 and the barrier layer 114 until a surface of the sacrificial layer 112 is exposed to form the access openings 120. As depicted in FIG. 15A, the access openings 120 is formed through the membrane 132 of the epi-poly cap layer 130 and the bather layer 1145 to provide access to the sacrificial layer 112 for the introduction of the etchant material.

The substrate 110 continues to undergo an etching process. As depicted in FIG. 16A, a vHF acid is used to dissolve a portion of the sacrificial layer 112 below the openings 120 until a cavity 122 is formed and release the membrane 132. The cavity 122 defines a gap of the membrane 124 that is between the openings 120 and the substrate 110. The membrane 132 of the epi-poly cap layer 130 and the bather layer 114 suspended above the substrate 110 are supported by support structure 126 formed by the trench 116 that is filled with polysilicon material 118. In alternate embodiments, the cavity 122 may be in proximal to the openings 120. FIG. 16B illustrates a top view of the substrate 110 with the cavity 122 formed after the etching process.

Figure 16C:
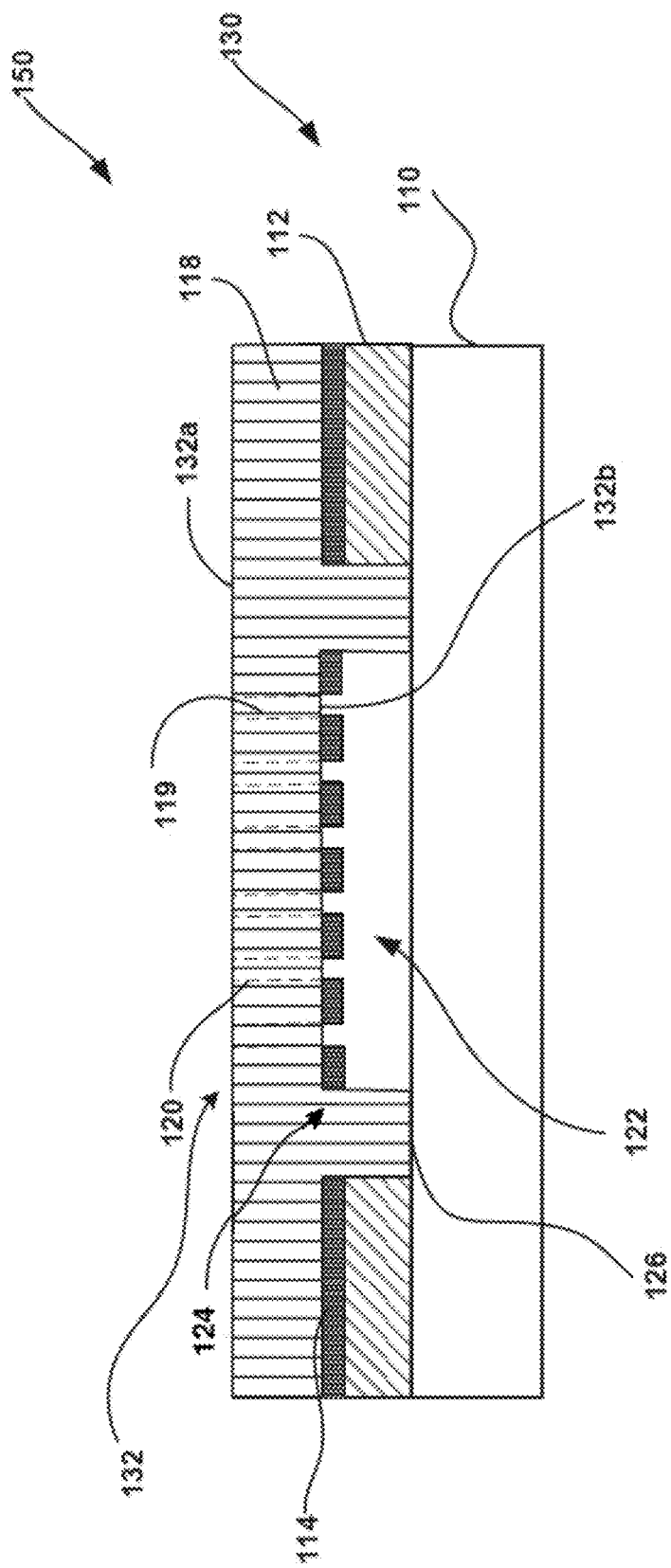
FIG. 16C is a cross sectional view of the substrate of FIG. 16A after an epitaxial deposition of a refill material in the access openings to reseal the access openings.

The substrate 110 is then placed in the epitaxial reactor again for epitaxial growth. During this process, a refill material 119 grows epitaxially in the openings 120. In one embodiment, the refill material 119 may be polysilicon layer. In an alternate embodiment, the refill material 119 grown in the openings 120 may be different from the cap layer material 118 grown on the sacrificial layer 112 and the substrate 110. As shown in FIG. 16C, the epi-polysilicon 119 is grown in and reseals the openings 120. The inner surface 132b of the membrane 132 is proximal to the cavity 122 and faces the substrate 110. The resulting MEMS device has a reduced surface roughness formed on the cap layer 130. The use of the bather layer 114 during the etching process prevents the silicon on the underside of the epi-polysilicon layers 118, 119 from migrating and forming a rough surface on the second surface 132b of the membrane 132.

Methods of employing the above described schemes can be implemented into various integrated circuit devices or MEMS devices. The integrated circuit devices and MEMS devices can include, but are not limited to, microphones, speakers, transducers, inertia sensors such as gyroscopes, accelerometers, motion sensors, optical sensors, imaging sensors, memory chips, and the like.

The devices can then be integrated into various electronic devices such as a mobile phone, computer monitor, a laptop, a tablet, a personal digital assistant (PDA), a hand-held computer, an automotive, a game console, an audio player, a video player, a cable player, a camera, a wearable device, a scanner, a projector, home appliances, and the like.

The embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling with the sprit and scope of this disclosure.

What is claimed is:

1. A microelectromechanical system (MEMS) device, comprising:
   a substrate;
   a barrier layer deposited on the substrate;
   an etched structure defined in a first portion of the barrier layer;
   an epitaxial cap layer deposited in the etched structure and on the barrier layer;
   a plurality of openings defined through a cap layer portion of the cap layer and through a second portion of the barrier layer, the cap layer portion directly contacting at least the second portion of the barrier layer between two openings of a portion of the plurality of openings defined through the barrier layer; and
   an epitaxial refill material deposited in the plurality of openings defined through the cap layer so as to seal the plurality of openings.

2. The MEMS device of claim 1, wherein the cap layer is formed from a polysilicon layer.

3. The MEMS device of claim 1, wherein the cap layer includes a surface opposed to the substrate having a reduced surface roughness after the plurality of openings are sealed.

4. The MEMS device of claim 1, further comprising a sacrificial layer deposited on the substrate between the barrier layer and the substrate.

5. The MEMS device of claim 4, wherein the etched structure is defined in the first portion of the barrier layer and a first sacrificial layer portion of the sacrificial layer.

6. The MEMS device of claim 5, wherein a vHF released cavity between the barrier layer and the substrate is formed after a second sacrificial portion of the sacrificial layer is dissolved.

7. The MEMS device of claim 1, wherein the barrier layer is formed from Aluminum Oxide ($Al_2O_3$).

8. A method of manufacturing a microelectromechanical system (MEMS) device, comprising:
   depositing a barrier layer on a substrate;
   forming an etched structure in a first portion of the barrier layer;
   epitaxially growing a cap layer in the etched structure and on the barrier layer;
   forming a plurality of openings in a cap layer portion of the cap layer and in a second portion of the barrier layer such that the cap layer portion directly contacts at least the second portion of the barrier layer between two openings of a portion of the plurality of openings defined through the barrier layer; and
   epitaxially growing a refill material in the plurality of openings to seal the plurality of openings.

9. The method of claim 8, wherein the cap layer is formed from a polysilicon layer.

10. The method of claim 8, wherein the cap layer includes a surface opposed to the substrate having a reduced surface roughness after the plurality of openings are sealed.

11. The method of claim 10, further comprising:
    depositing a sacrificial layer on the substrate before depositing the barrier layer.

12. The method of claim 11, wherein:
    the forming of the etched structure includes forming the etched structure in the first portion of barrier layer and in a first sacrificial layer portion of the sacrificial layer.

13. The method of claim 12, further comprising:
    dissolving a second sacrificial layer portion of the sacrificial layer; and
    forming a vHF released cavity between the barrier layer and the substrate after the second sacrificial layer portion of the sacrificial layer is dissolved.

14. The method of claim 8, wherein the barrier layer is formed from Aluminum Oxide ($Al_2O_3$).

15. A microelectromechanical system (MEMS) device, comprising:
    a substrate;
    a barrier layer formed from Aluminum Oxide ($Al_2O_3$);
    an etched structure defined in a portion of the barrier layer;
    an epitaxial polysilicon cap layer deposited in the etched structure and on the barrier layer,
        wherein the barrier layer is formed between the substrate and the epitaxial polysilicon cap layer,
        wherein the epitaxial polysilicon cap layer is mounted on the substrate by support structures to form a cavity between the epitaxial polysilicon cap layer and the substrate,
        wherein the epitaxial polysilicon cap layer forms a flexible membrane suspended above the substrate by the support structures,
        wherein the flexible membrane includes a first surface facing away from the substrate and a second surface facing towards the substrate and the barrier layer and defines a portion of the cavity, and
        wherein a plurality of openings are defined through a portion of the epitaxial polysilicon cap layer and through the barrier layer; and
    an epitaxial refill material deposited in the plurality of openings within the epitaxial polysilicon cap layer so as to seal the plurality of openings.

* * * * *

UNITED STATES PATENT AND TRADEMARK OFFICE
CERTIFICATE OF CORRECTION

PATENT NO. : 10,494,253 B2
APPLICATION NO. : 16/066580
DATED : December 3, 2019
INVENTOR(S) : Stehle et al.

It is certified that error appears in the above-identified patent and that said Letters Patent is hereby corrected as shown below:

On the Title Page

At item (57), Line 3 of the abstract, "(Al2O3)" should read --($Al_2O_3$)--.

In the Claims

In Claim 7, at Column 9, Line 60: "($Al_2O_3$)" should read --($Al_2O_3$)--.

In Claim 14, at Column 10, Line 34: "($Al_2O_3$)" should read --($Al_2O_3$)--.

In Claim 15, at Column 10, Line 38: "($Al_2O_3$)" should read --($Al_2O_3$)--.

Signed and Sealed this
Twenty-fourth Day of March, 2020

Andrei Iancu
*Director of the United States Patent and Trademark Office*